United States Patent
Seo et al.

(10) Patent No.: US 10,642,150 B2
(45) Date of Patent: May 5, 2020

(54) PHOTOMASK AND METHOD FOR MANUFACTURING COLUMN SPACER FOR COLOR FILTER USING THE SAME

(71) Applicant: LG CHEM, LTD., Seoul (KR)

(72) Inventors: Dae Han Seo, Daejeon (KR); Dong Chang Choi, Daejeon (KR); Kwang Han Park, Daejeon (KR); Sang Choll Han, Daejeon (KR); Jae Jin Kim, Daejeon (KR); Eun Joo Choi, Daejeon (KR); Min Soo Song, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/476,267

(22) Filed: Mar. 31, 2017

(65) Prior Publication Data
US 2017/0285459 A1  Oct. 5, 2017

(30) Foreign Application Priority Data

Mar. 31, 2016 (KR) .................. 10-2016-0038796

(51) Int. Cl.
*G03F 1/38* (2012.01)
*G03F 7/00* (2006.01)
(Continued)

(52) U.S. Cl.
CPC .............. *G03F 1/38* (2013.01); *G03F 7/0007* (2013.01); *G03F 7/038* (2013.01); *G03F 7/16* (2013.01); *G03F 7/20* (2013.01)

(58) Field of Classification Search
CPC ..... G03F 1/38; G03F 1/50; G03F 1/58; G03F 7/0007; G03F 7/038; G03F 7/16; G03F 7/20; G03F 7/00
See application file for complete search history.

(56) References Cited

U.S. PATENT DOCUMENTS

| | | | |
|---|---|---|---|
| 5,830,605 A * | 11/1998 | Umeki ................. | G02B 3/0012 430/5 |
| 7,190,433 B2 * | 3/2007 | Yoshinaga .............. | G03F 7/703 355/47 |

(Continued)

FOREIGN PATENT DOCUMENTS

| | | | | |
|---|---|---|---|---|
| JP | 62-221111 | * | 9/1987 | .......... H01L 21/265 |
| JP | 04-096065 | * | 3/1992 | ............... G03F 1/08 |

(Continued)

OTHER PUBLICATIONS

Machine translatiopn of JP 2008-046624 (Feb. 2008).*
Machine translation of JP 2009-180784 (2009).*

*Primary Examiner* — Martin J Angebranndt
(74) *Attorney, Agent, or Firm* — Rothwell, Figg, Ernst & Manbeck, P.C.

(57) ABSTRACT

The present invention relates to a photomask and a method for manufacturing a column spacer for a color filter using the same, and according to one aspect of the present invention, a photomask is provided, which comprises a central region having a first transmittance, a first perimeter region surrounding the central region and having a second transmittance lower than the first transmittance, and a second perimeter region surrounding the first perimeter region and having the first transmittance.

6 Claims, 12 Drawing Sheets
(8 of 12 Drawing Sheet(s) Filed in Color)

(51) Int. Cl.
  *G03F 7/16* (2006.01)
  *G03F 7/20* (2006.01)
  *G03F 1/50* (2012.01)
  *G03F 7/038* (2006.01)

(56) References Cited

U.S. PATENT DOCUMENTS

| | | | |
|---|---|---|---|
| 7,423,700 B2 * | 9/2008 | Kim | G11B 7/13927 349/187 |
| 8,176,929 B1 * | 5/2012 | Collins | F16L 41/12 137/15.12 |
| 9,709,842 B2 * | 7/2017 | Jang | G02F 1/133512 |
| 2002/0021390 A1 * | 2/2002 | Jang | G02F 1/133553 349/113 |
| 2010/0294651 A1 * | 11/2010 | Yamada | G03F 1/50 204/192.26 |

FOREIGN PATENT DOCUMENTS

| | | | | |
|---|---|---|---|---|
| JP | 09-283434 | * | 10/1997 | ............... G03F 7/20 |
| JP | 10-319568 | * | 12/1998 | ............... G03F 1/08 |
| JP | 2001-033790 | * | 2/2001 | ........... G02F 1/1339 |
| JP | 2001-222003 | * | 8/2001 | ........... G02F 1/1335 |
| JP | 2002-229040 | * | 8/2002 | ........... G02F 1/1339 |
| JP | 2003-107721 | * | 4/2003 | ............... G03F 7/20 |
| JP | 2004-280006 | * | 10/2004 | ............... G03F 7/40 |
| JP | 2006-018188 | * | 1/2006 | ............... G03F 7/20 |
| JP | 2007-333926 | * | 12/2007 | ............... G03F 7/20 |
| JP | 2008-003543 | * | 1/2008 | ............... G03F 1/08 |
| JP | 2008-046624 | * | 2/2008 | ............... G02B 5/20 |
| JP | 2009-009058 | * | 1/2009 | ............... G03F 1/08 |
| JP | 2009-180784 A | | 8/2009 | |
| JP | 2010-014931 | * | 1/2010 | ............... G02F 1/08 |
| JP | 2010-175597 | * | 8/2010 | ............... G02B 5/20 |
| JP | 2012-103474 | * | 5/2012 | ........... G02F 1/1339 |
| KR | 10-2015-0077104 A | | 7/2015 | |

* cited by examiner

[Figure 1]
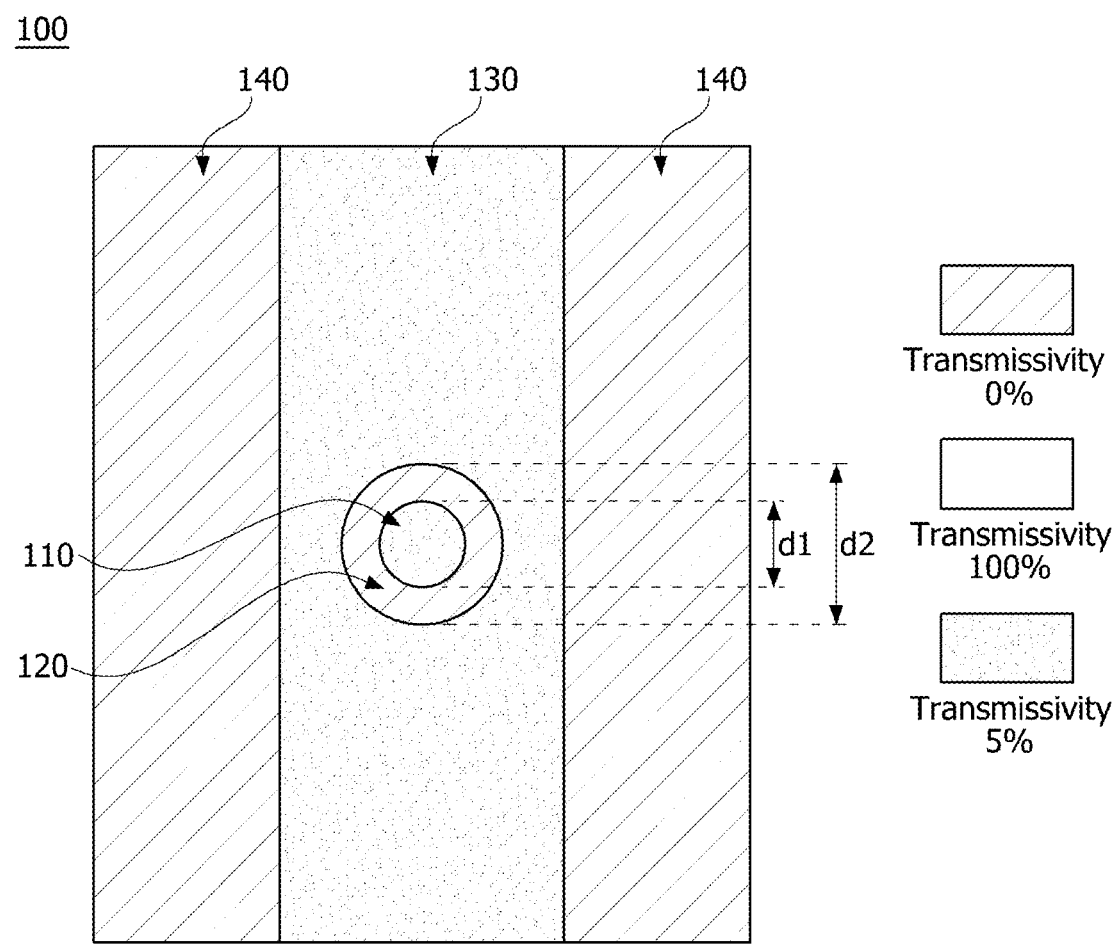

[Figure 2]
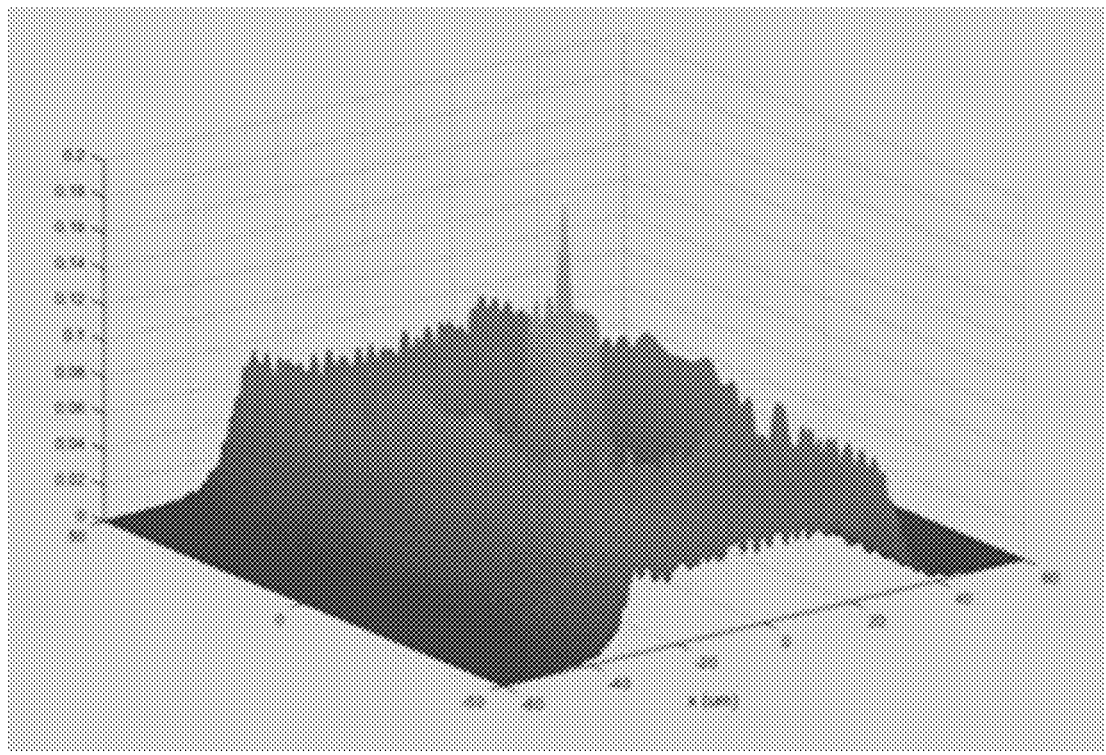

[Figure 3]
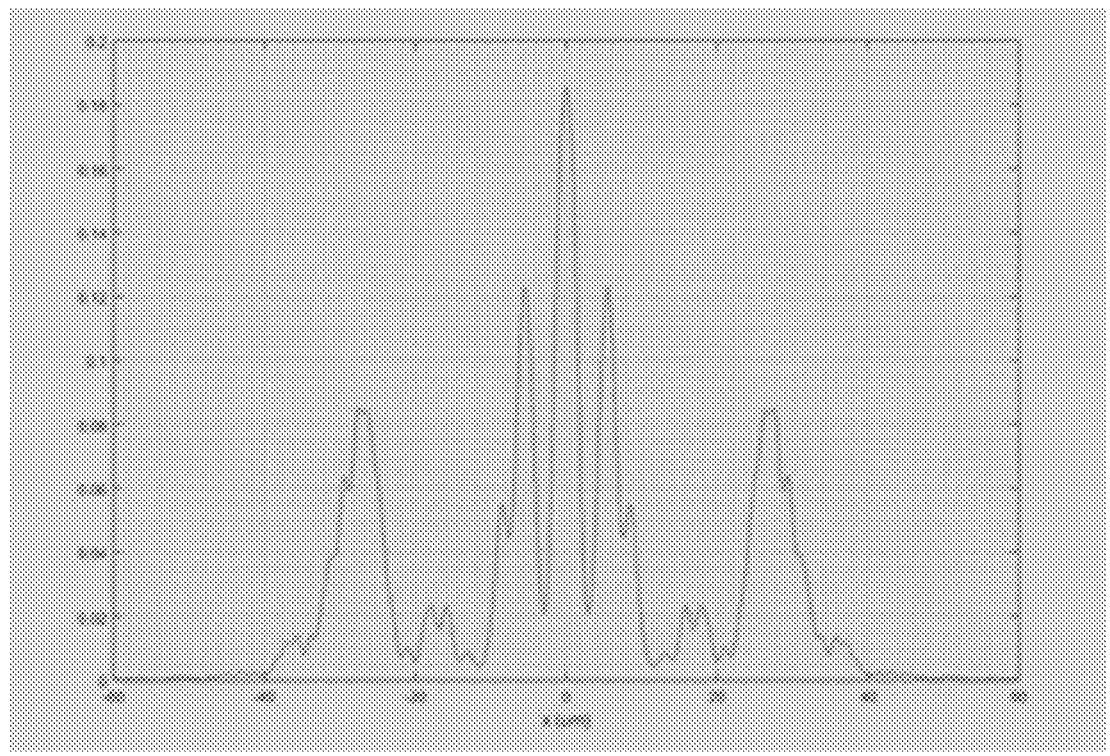
[Figure 4]
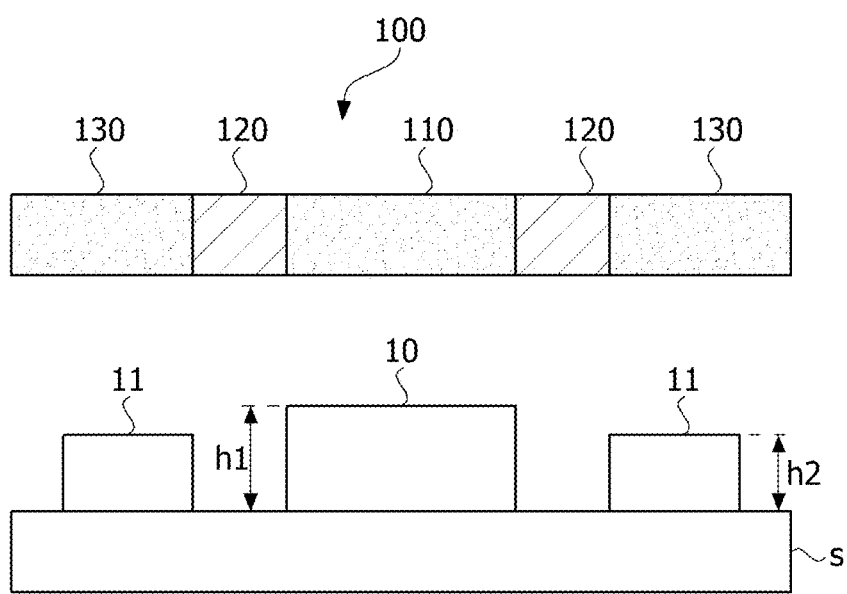

[Figure 5]
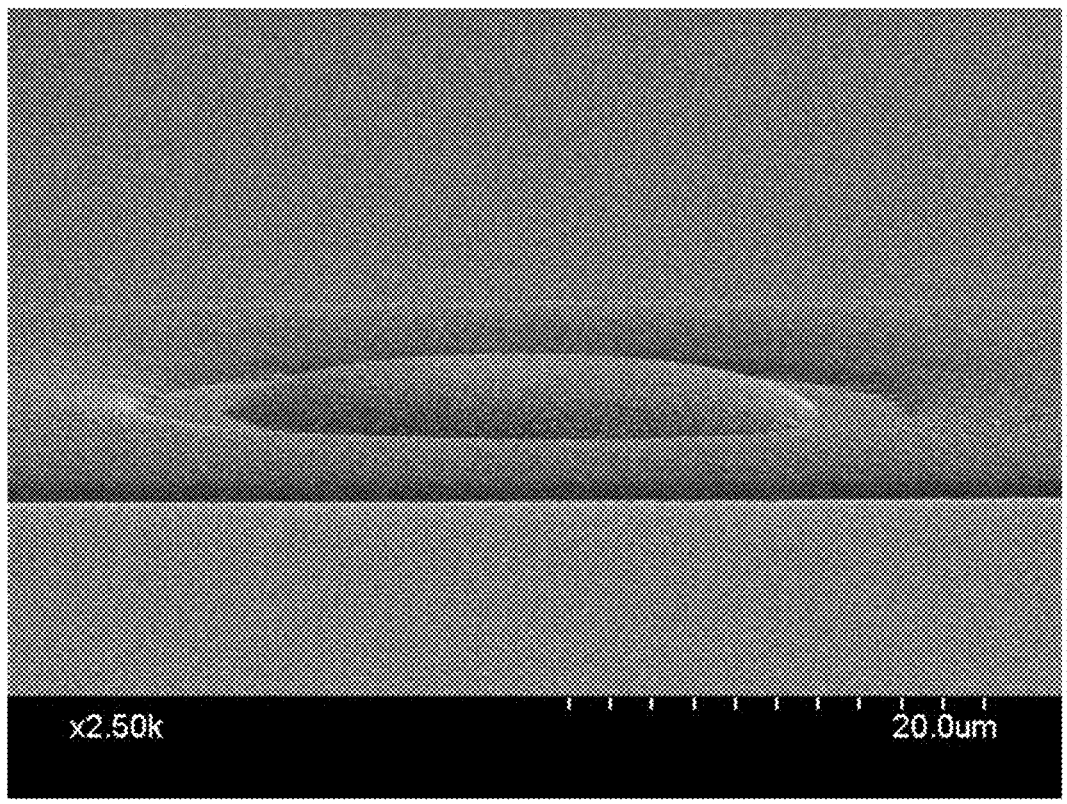

[Figure 6]
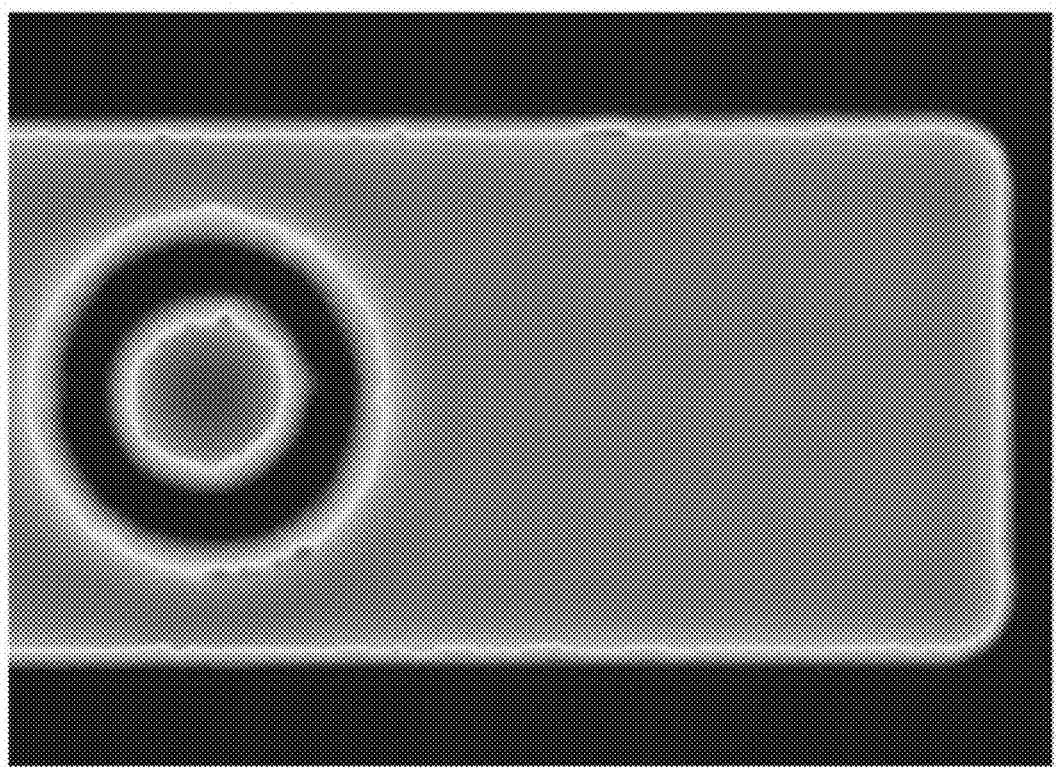

[Figure 7]
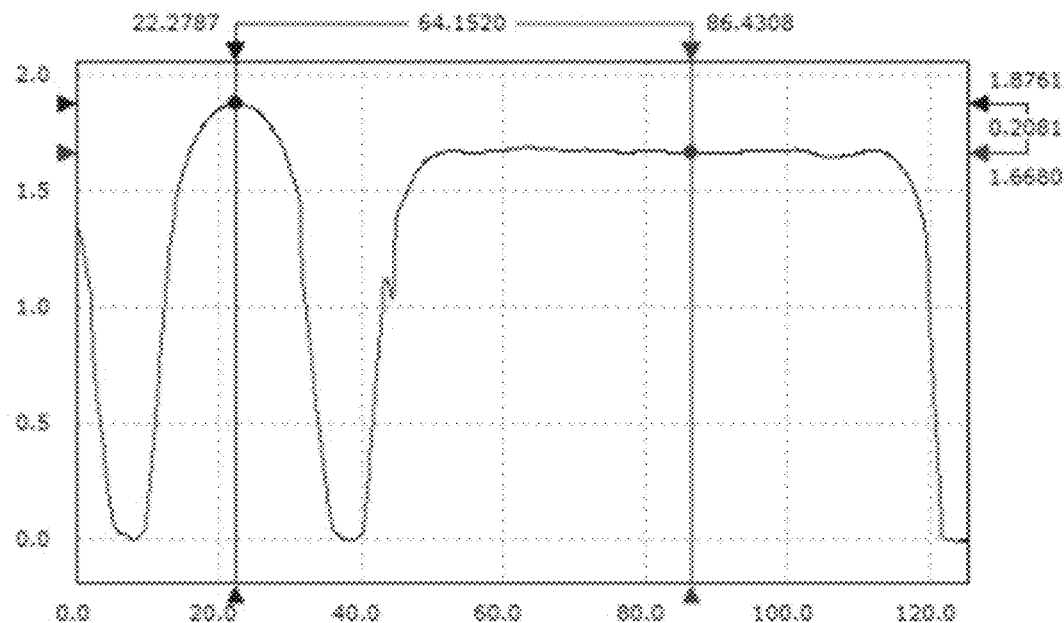
[Figure 8]
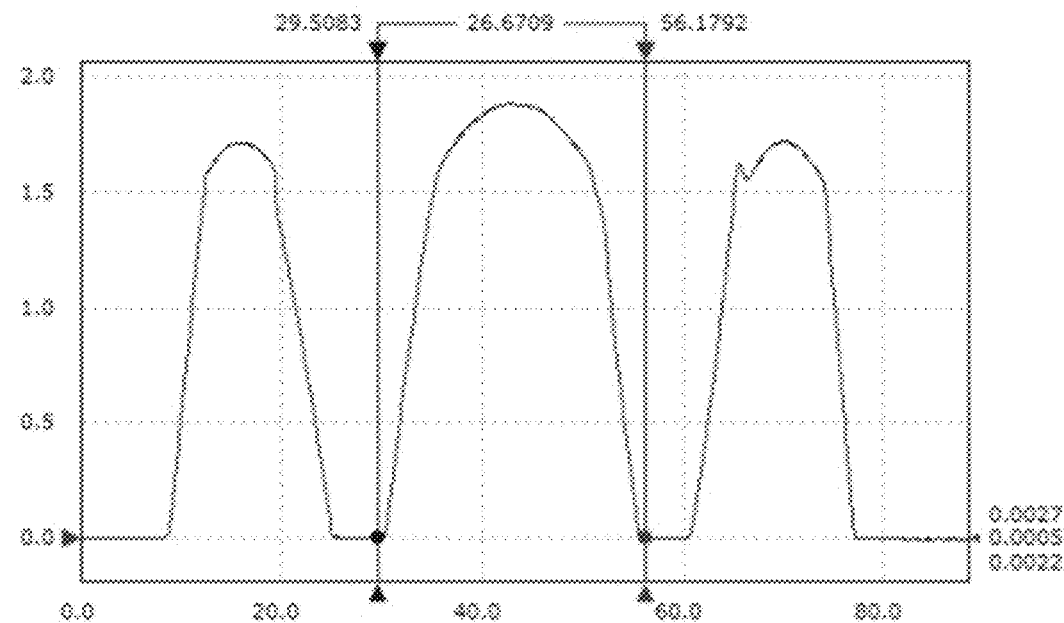

[Figure 9]
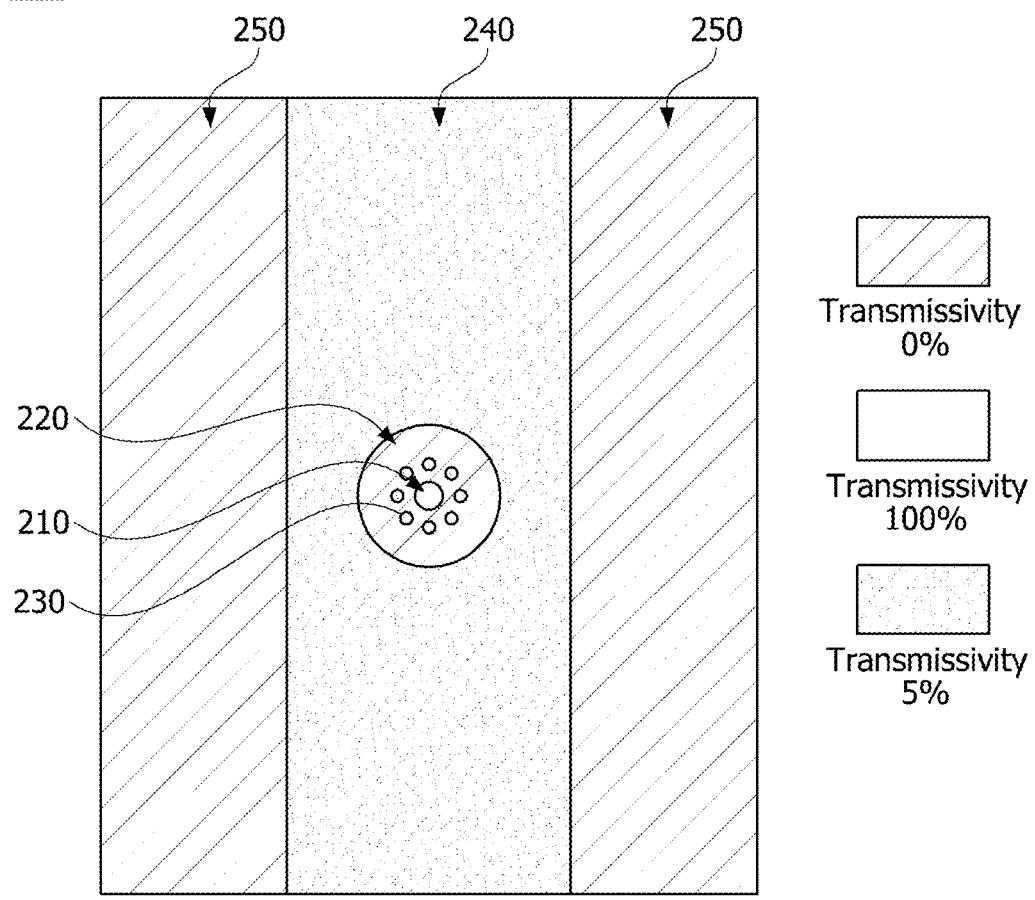

[Figure 10]
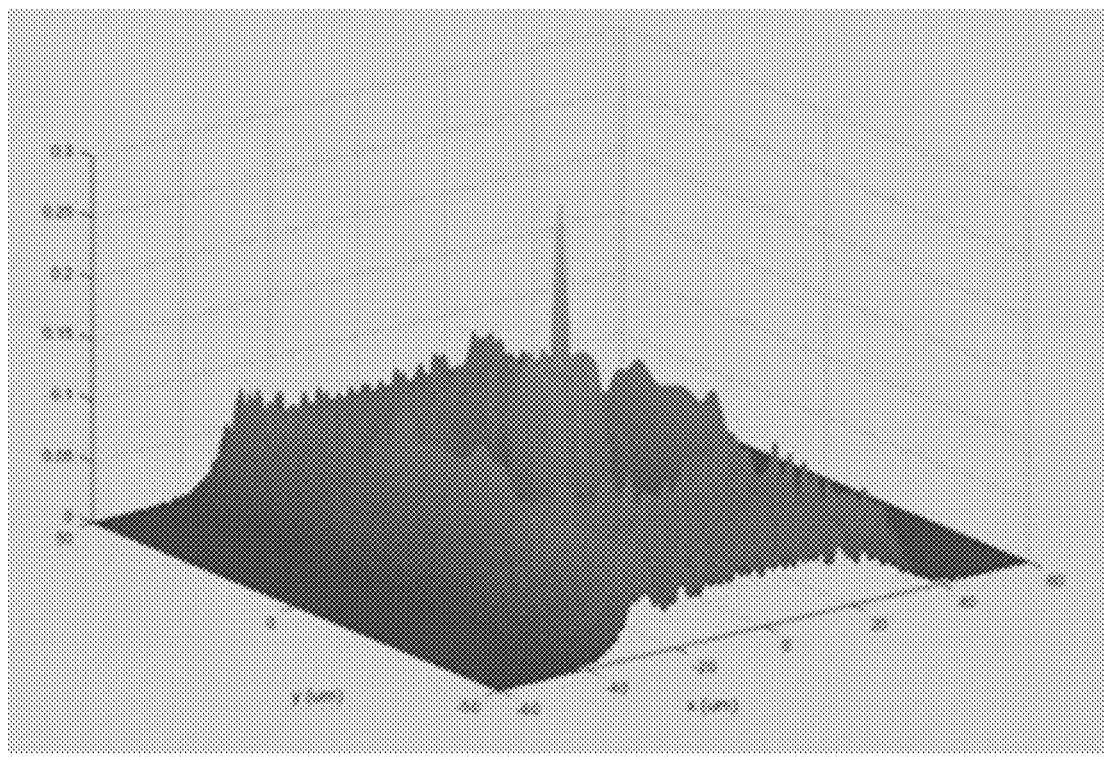

[Figure 11]
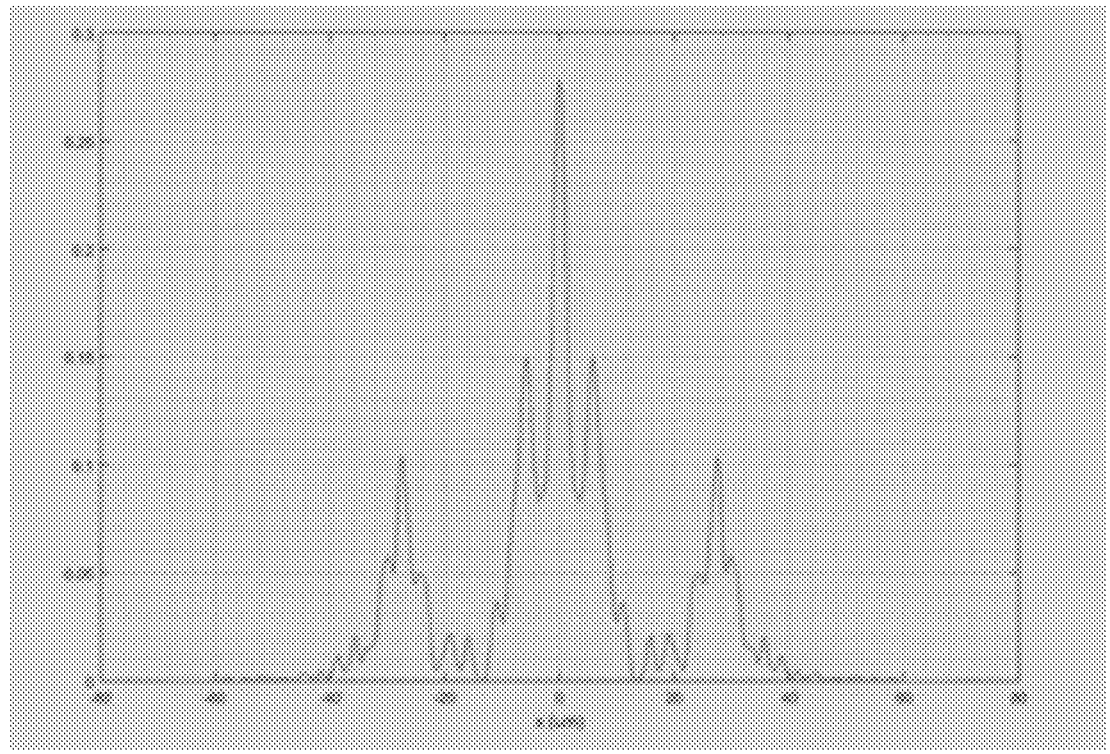
[Figure 12]
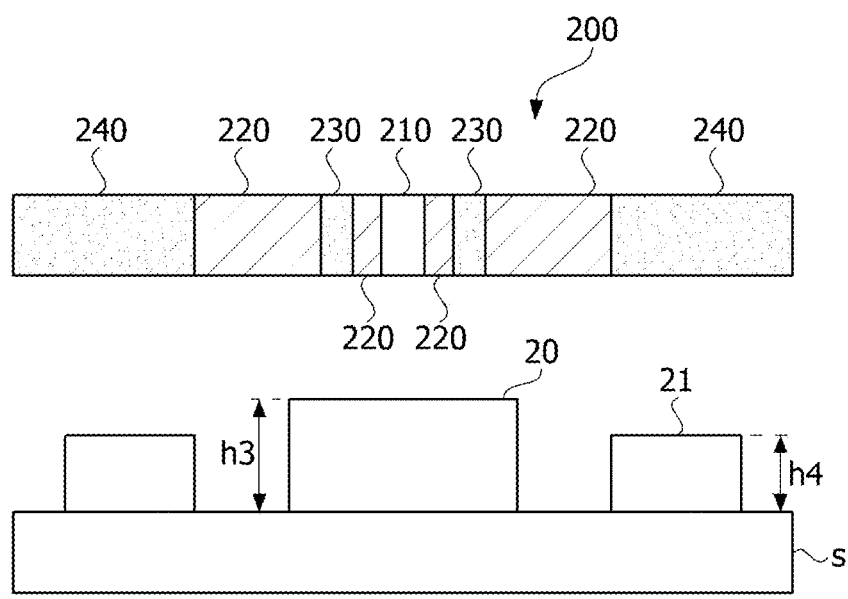

[Figure 13]
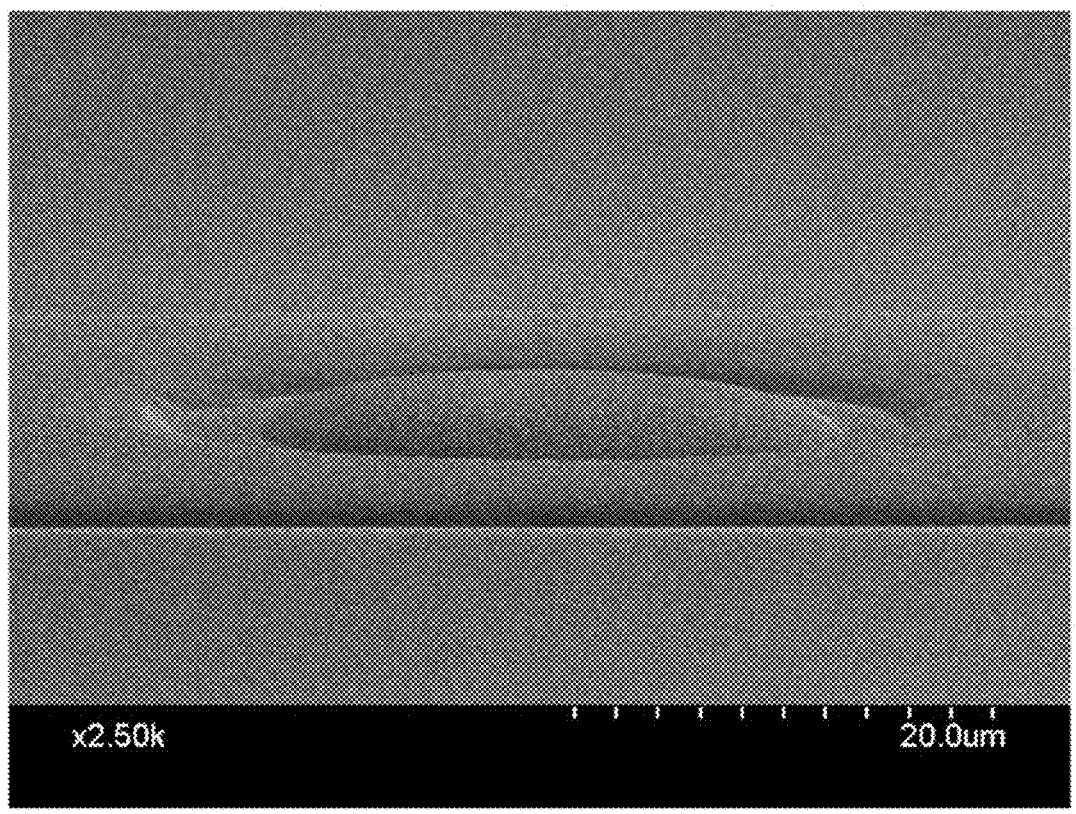

[Figure 14]
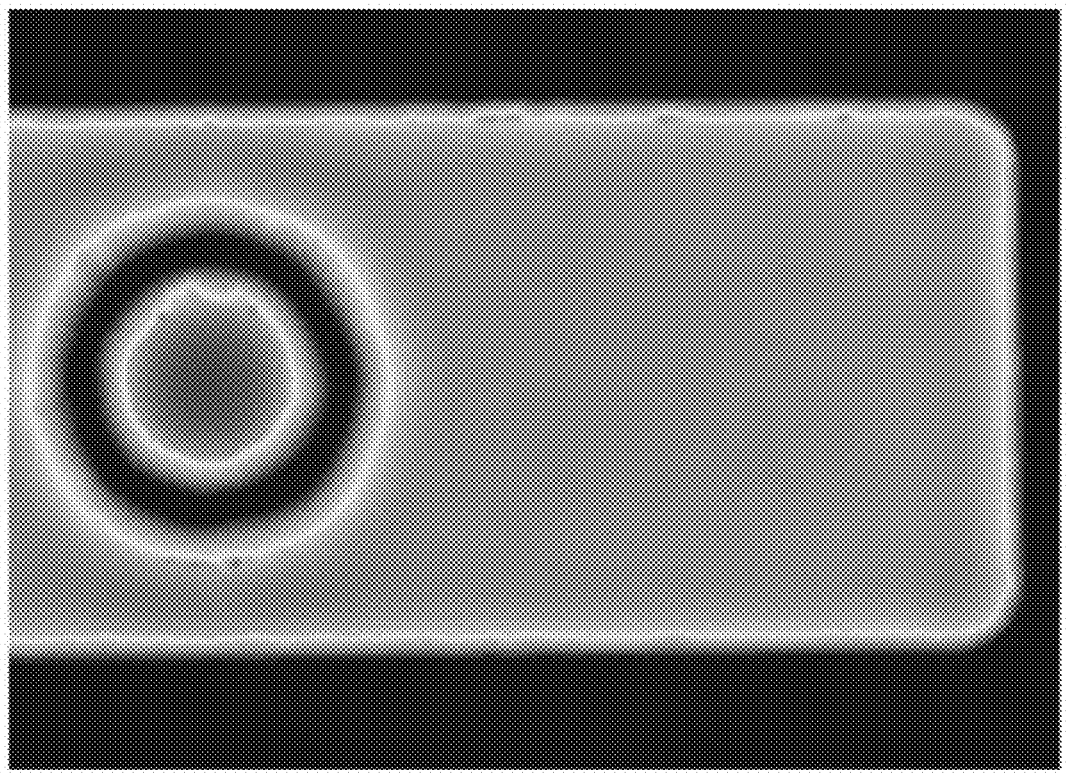
[Figure 15]
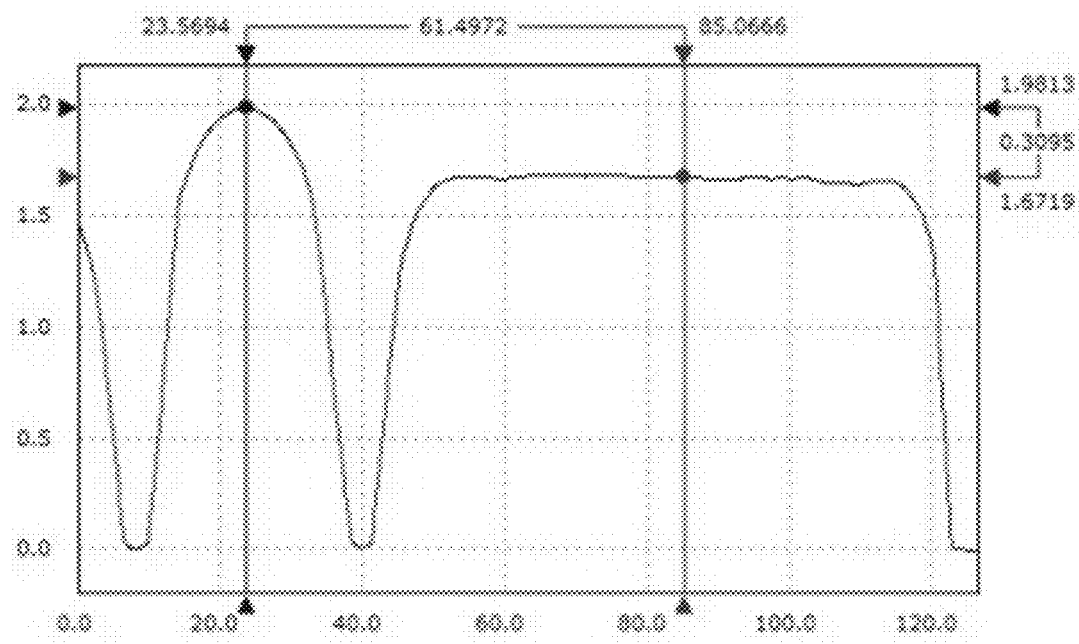

[Figure 16]
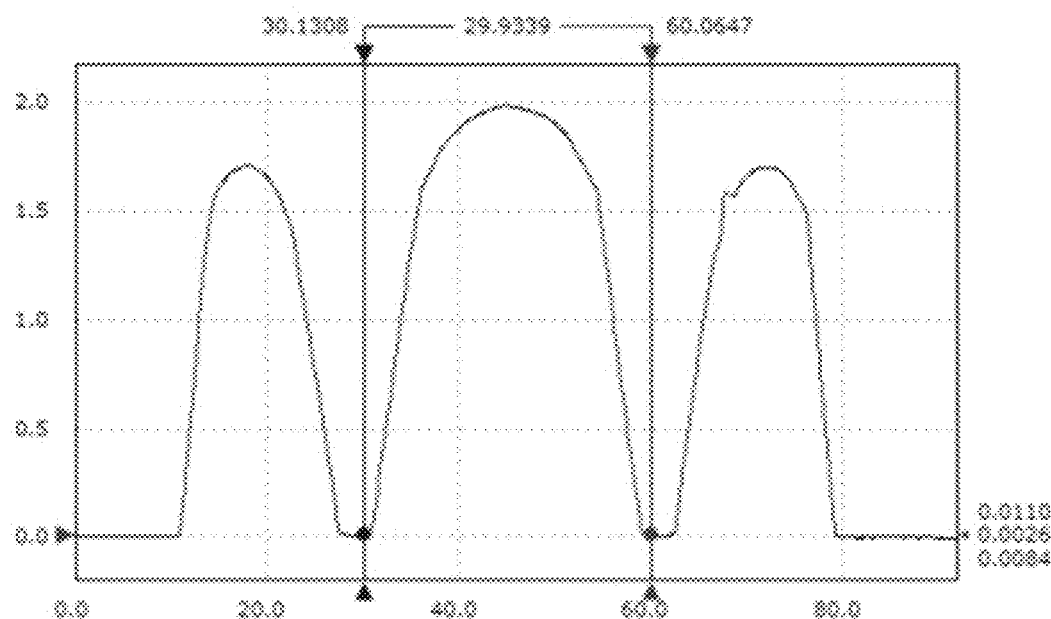

PHOTOMASK AND METHOD FOR MANUFACTURING COLUMN SPACER FOR COLOR FILTER USING THE SAME

CROSS-REFERENCE TO RELATED APPLICATIONS

This application claims priority under 35 U.S.C. § 119 to Korean Patent Application No. 10-2016-0038796, filed on Mar. 31, 2016, the entire content of which is incorporated herein by reference.

TECHNICAL FIELD

The present invention relates to a photomask and a method for manufacturing a column spacer (CS) for a color filter using the same.

BACKGROUND ART

In general, a column spacer used in a color filter of a display device is manufactured using a negative photoresist.

Furthermore, it was confirmed via tests that after coating PR in a thickness of 2.2 µm, the height of 2.2 µm remained when exposed using a photomask with a transmittance of 100%, the height of about 1.8 µm when exposed using a photomask with a transmittance of 10%, the height of about 1.6 µm remained when exposed using a photomask with a transmittance of 5% and the height of 0 µm remained when exposed using a photomask with a transmittance of 0%. That is, in order to produce a shape having four steps in total through one exposure, other areas having four transmissivities are required.

However, when the difference in the transmittances of the photomask for each area is not large, there is a problem that even if four tones are used, no PR pattern is made according to the pattern shape of the photomask, and as the tones of the photomask increase, there is a problem that the production cost increases.

DISCLOSURE

Technical Problem

It is a technical problem of the present invention to provide a photomask having a pattern arrangement capable of utilizing diffraction and interference phenomena at the time of exposure, and a method for manufacturing a column spacer for a color filter using the same.

It is another technical problem of the present invention to provide a photomask capable of patterning a column spacer pattern having four heights with a photomask having three transmissivity regions, and a method for manufacturing a column spacer for a color filter using the same.

Technical Solution

To solve the above problems, according to one aspect of the present invention, a photomask is provided, which comprises a central region having a first transmittance, a first perimeter region surrounding the central region and having a second transmittance lower than the first transmittance, and a second perimeter region surrounding the first perimeter region and having the first transmittance.

In addition, according to another aspect of the present invention, a method for manufacturing a column spacer for a color filter is provided, which comprises steps of coating a negative type photoresist on a substrate and exposing the substrate using the photomask.

Also, according to another aspect of the present invention, a photomask is provided, which comprises a central region having a first transmittance, a first perimeter region surrounding the central region and having a second transmittance lower than the first transmittance, a plurality of circular regions positioned in the first perimeter region and arranged along the circumferential direction based on the central region and having a third transmittance higher than the second transmittance and a second perimeter region surrounding the first perimeter region and having the third transmittance.

Also, according to still another aspect of the present invention, a method for manufacturing a column spacer for a color filter is provided, which comprises steps of coating a negative type photoresist on a substrate, and exposing the substrate using the photomask.

Effects of Invention

As described above, the photomask associated with at least one example of the present invention and the method for manufacturing a column spacer for a color filter using the same have the following effects.

The photomask has a pattern arrangement capable of utilizing diffraction and interference phenomena at the time of exposure. Through this, a column spacer pattern of four heights can be patterned with a photomask having three transmissivity regions.

Therefore, since the transmissivity region can be reduced, the manufacturing cost can be reduced and the shape of photosensitizer patterns can be improved.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 1 is a plan view of a photomask associated with a first example of the present invention.

FIGS. 2 and 3 are simulation results using the photomask as shown in FIG. 1.

FIG. 4 is a conceptual diagram showing an exposure process using the photomask as shown in FIG. 1.

FIGS. 5 to 8 are measurement results using the photomask as shown in FIG. 1.

FIG. 9 is a plan view of a photomask associated with a second example of the present invention.

FIGS. 10 and 11 are simulation results using the photomask as shown in FIG. 9.

FIG. 12 is a conceptual diagram showing an exposure process using the photomask as shown in FIG. 9.

FIGS. 13 to 16 are measurement results using the photomask as shown in FIG. 9.

DETAILED DESCRIPTION OF INVENTION

Hereinafter, a photomask according to one example of the present invention and a method for manufacturing a column spacer for a color filter using the same will be described in detail with reference to the accompanied drawings.

In addition, the same or corresponding components regardless of reference numerals are given by the same or similar reference numerals, for which the redundant description will be omitted, and for convenience of explanation, the size and shape of each constituent member as shown in the drawings may be exaggerated or reduced.

FIG. 1 is a plan view of a photomask (100) associated with a first example of the present invention, FIGS. 2 and 3 are simulation results using the photomask as shown in FIG. 1 and FIG. 4 is a conceptual diagram showing an exposure process using the photomask as shown in FIG. 1. In addition, FIGS. 5 to 8 are measurement results using the photomask as shown in FIG. 1, which are SEM images and optical profiler measurement results.

In particular, FIGS. 2 and 3 are simulation results showing a normalized intensity profile at the time of exposure using the photomask (100).

Referring to FIG. 1, the photomask (100) associated with the first example comprises a central region (110) having a first transmittance, a first perimeter region (120) surrounding the central region (110) and having a second transmittance lower than the first transmittance, and a second perimeter region (130) surrounding the first perimeter region (120) and having the first transmittance. Here, the first transmittance may be 5%. Also, the second transmittance may be 0%. In addition, the photomask (100) may comprise a third perimeter region (140) arranged outside the second perimeter region (130) and having the second transmittance.

In addition, the central region (110) may have a circular shape having a predetermined diameter, and the first perimeter region (120) may have a ring shape surrounding the central region (110).

Furthermore, the center region (100) may have a diameter (d1) of 20 to 30 μm and the first perimeter region (120) may have an inner diameter of 20 to 30 μm and an outer diameter (d2) of 35 to 55 μm, and for example, the center region (100) may have a diameter (d1) of about 25 μm and the first perimeter region (120) may have an inner diameter of about 25 μm and an outer diameter (d2) of about 40 μm.

Referring to FIG. 4, it is confirmed that at the time of exposure using the photomask (100), the height of the central region column (10) on the substrate (S) is about 1.8 μm and the height of the outer region column (11) is about 1.6 μm. Particularly, with respect to the central region column (10), the height patterned with about 10% transmissivity region can be obtained by diffraction and interference phenomena at a boundary area of the central region (110) (transmittance 5%) and the first perimeter region (120) (transmittance 0%) in the photomask (see FIGS. 2 and 3).

In addition, a method for manufacturing a column spacer for a color filter associated with one example of the present invention comprises steps of coating a negative type photoresist on a substrate (S) and exposing the substrate using the photomask (100).

FIG. 9 is a plan view of the photomask (200) associated with the second example of the present invention, FIGS. 10 and 11 are simulation results using the photomask as shown in FIG. 9, FIG. 12 is a conceptual diagram showing an exposure process using the photomask as shown in FIG. 9, FIGS. 13 to 16 are measurement results using the photomask as shown in FIG. 9, which are SEM images and optical profiler measurement results.

In particular, FIGS. 10 and 11 are simulation results showing a normalized intensity profile at the time of exposure using the photomask (200).

Referring to FIG. 9, the photomask (200) associated with the second example comprises a central region (210) having a first transmittance, a first perimeter region (220) surrounding the central region (210) and having a second transmittance lower than the first transmittance, a plurality of circular regions (230) positioned in the first perimeter region (220) and arranged along the circumferential direction based on the central region and having a third transmittance higher than the second transmittance, and a second perimeter region (240) surrounding the first perimeter region (220) and having the third transmittance. In addition, the photomask (100) may comprise a third perimeter region (250) arranged outside the second perimeter region (240) and having the second transmittance.

At this time, the first transmittance may be 100%, the second transmittance may be 0%, and the third transmittance may be 5%.

In addition, the central region (210) may have a circular shape having a predetermined diameter, and the first perimeter region (220) may have a ring shape surrounding the central region. Also, the central region (210) may have a diameter of 5 to 9 μm, the circular region (230) may have a diameter of 3 to 5 μm and the first perimeter region (220) may have an outer diameter of 38 to 42 μm, and for example, the central region (210) may have a diameter of 7 μm, the circular region (230) may have a diameter of 4 μm and the first perimeter region (220) may have an outer diameter of 40 μm. Also, the distance between the center of the central region (210) and the center of the circular region (230) may be 6 to 12 μm, and for example, the distance between the center of the central region (210) and the center of the circular region (230) may be 8 μm. In addition, eight circular regions (230) may be provided.

Referring to FIG. 12, it is confirmed that at the time of exposure using the photomask (200), the height of the central region column (20) on the substrate (S) is about 1.9 μm and the height of the outer region column (21) is about 1.6 μm. Particularly, with respect to the central region column (20), the height patterned with about 10% transmissivity region can be obtained by diffraction and interference phenomena at a boundary area of the central region (210) (transmittance 100%), the first perimeter region (220) (transmittance 0%), and the circular region (230) (transmittance 5%) in the photomask (see FIGS. 6 and 7).

In addition, a method for manufacturing a column spacer for a color filter associated with one example of the present invention comprises steps of coating a negative type photoresist on a substrate (S) and exposing the substrate using the photomask (200).

The preferred examples of the present invention as described above are disclosed for illustrative purposes, which can be modified, changed and added within thought and scope of the present invention by those skilled in the art and it will be considered that such modification, change and addition fall within the following claims.

DESCRIPTION OF REFERENCE NUMERALS 100, 200: photomask

The invention claimed is:

1. A photomask comprising:
a central region having a first transmittance;
a first perimeter region surrounding said central region and having a second transmittance lower than the first transmittance;
a plurality of circular regions positioned in said first perimeter region and arranged along the circumferential direction based on the central region and having a third transmittance higher than the second transmittance; and
a second perimeter region surrounding the first perimeter region, having an outer edge that forms a rectangle, and having the third transmittance; and a third perimeter region located on an exterior of two sides of the second perimeter region, and having the second transmittance, and wherein the first transmittance is 100%, the second transmittance is 0%, and the third transmittance is 5%.

2. The photomask according to claim 1, wherein the central region has a circular shape having a predetermined diameter, and the first perimeter region has a ring shape surrounding the central region.

3. The photomask according to claim 2, wherein
the central region has a diameter of 5 to 9 μm,
the circular region has a diameter of 3 to 5 μm, and
the first perimeter region has an outer diameter of 38 to 42 μm.

4. The photomask according to claim 3, wherein a distance between the centers of the central region and the circular region is 6 to 12 μm.

5. The photomask according to claim 1, wherein eight circular regions are provided.

6. A method for manufacturing a column spacer for a color filter, comprising steps of
coating a negative type photoresist on a substrate; and
exposing the substrate using the photomask according to claim 1.

* * * * *